United States Patent [19]

Murakami et al.

[11] Patent Number: 4,684,782

[45] Date of Patent: Aug. 4, 1987

[54] CONTROL SYSTEM FOR A CHARGED PARTICLE BEAM APPARATUS

[75] Inventors: Hidenobu Murakami; Seiji Yasunaga, both of Amagasaki, Japan

[73] Assignee: Mitsubishi Denki Kabushiki Kaisha, Tokyo, Japan

[21] Appl. No.: 774,735

[22] Filed: Sep. 11, 1985

[30] Foreign Application Priority Data

Sep. 19, 1984 [JP] Japan ................................. 59-198122

[51] Int. Cl.$^4$ ............................................. B23K 15/00
[52] U.S. Cl. ...................... 219/121 EA; 219/121 EC
[58] Field of Search .................. 219/121 EA, 121 EB, 219/121 EC, 121 ED, 121 EP, 69 C; 250/397

[56] References Cited

U.S. PATENT DOCUMENTS

| | | | |
|---|---|---|---|
| 3,826,889 | 7/1974 | Brukovsky et al. | 219/121 EA |
| 3,838,313 | 9/1974 | Anderson | 219/121 EA X |
| 3,884,790 | 5/1975 | Kobayashi et al. | 204/224 M |
| 4,238,660 | 12/1980 | Bell, Jr. et al. | 219/69 G |

FOREIGN PATENT DOCUMENTS 0036748  3/1980  Japan ................................. 323/218

Primary Examiner—C. L. Albritton
Attorney, Agent, or Firm—Oblon, Fisher, Spivak, McClelland, & Maier

[57] ABSTRACT

A feedback signal of a beam accelerating voltage, which is input into a feedback control system is fixed at a predetermined value corresponding to a signal under the condition before generation of arcing, when the arcing is generated, and thereafter, the fixed feedback signal is released to continue a feedback control.

12 Claims, 9 Drawing Figures

CONTROL SYSTEM FOR A CHARGED PARTICLE BEAM APPARATUS

BACKGROUND OF THE INVENTION

1. Field of the Invention

The present invention relates to a control system for a charged particle beam apparatus with a power source unit of a high voltage and a high power output, which is capable of instantaneous self-restoration of a load-short-circuit caused by an electric discharge.

2. Description of Prior Art

FIG. 5 is a diagram showing the construction of an electron-beam welding apparatus as an example of conventional apparatuses.

In FIG. 5, a reference numeral 1 designates a controllable power source for an inverter, a numeral 2 designates a booster transformer connected to the output side of the controllable power source 1, a numeral 3 designates a rectifying circuit to rectify an alternating current output from the controllable power source 1, a numeral 4 designates a smoothing reactor, a numeral 5 designates a smoothing capacitor, a numeral 6 designates a cathode of a welding machine, a numeral 7 designates an anode of the welding machine, a numeral 8 designates an electron beam emitted from the cathode 6, a numeral 9 designate a Wehnelt electrode for controlling the current intensity of the electron beam 8, a numeral 10 designates a workpiece irradiated by the electron beam 8, a numeral 11 designates a controllable biasing power source which applies a voltage to the Wehnelt electrode 9, a numeral 12 designates an insulating transformer which supplies a power to the controllable biasing power source 11 to keep it at a high potential, a numeral 13 designates a detecting resistor to detect beam accelerating voltage $V_A$, a numeral 14 designates a constant-voltage controlling circuit for the beam accelerating voltage $V_A$, a numeral 15 designates a detecting resistor to detect a power source current $I_K$, a numeral 16 designates a constant-current controlling circuit for the power source current $I_K$, a numeral 17 designates optical fibers for transmitting an output of the constant-current controlling circuit 16 to the controllable biasing power source 11 at a high potential, and a numeral 18 designates a load-short-circuit (hereinbelow referred to as arcing) produced between the anode 7 and the Wehnelt electrode 9 or the cathode 6.

FIG. 6 is a diagram showing the construction of the constant-voltage controlling circuit 14 or the constant-current controlling circuit 16. In FIG. 6, a reference numeral 19 designates a feedback signal supplied from the detecting resistor 13 for the beam accelerating voltage $V_A$ or the detecting resistor 15 for the power source current $I_K$, a numeral 20 designates a low-pass filter for removing noises contained in the feedback signal, a numeral 21 designates a set signal, a numeral 22 designates a comparator for comparing the feedback signal 19 with the set signal 21, and a numeral 23 designates a controlled signal.

FIGS. 7 and 8 respectively show voltage and current waveforms appearing at each part of the apparatus when the arcing 18 takes place. In FIGS. 7 and 8, a symbol $V_A$ represents a beam accelerating voltage, a symbol $I_O$ represents a power source output current of the controllable power source 1, which is shown by an envelope of the peaks of a high frequency waveform, a symbol $I_K$ represents a power source current, a symbol $I_C$ represents a beam current, symbols t represent time, a reference numeral 24 represents generation of the first arcing, a numeral 25 represents generation of the second arcing and a numeral 26 represents interruption of the power source.

FIG. 9 shows a defect in a weld bead due to generation of the arcing, in which a reference numeral 27 designates a configuration of the surface of the weld bead, a numeral 28 designates a weld line, and a numeral 29 designates a longitudinal cross-sectional view of the weld bead.

The operation of the conventional control system for a charged particle beam apparatus will be described with reference to FIGS. 5 to 9.

In FIG. 5, an electric power supplied from the controllable power source 1 is stepped up in the booster transformer 2, then rectified by the rectifying circuit 3 and thereafter, smoothed by the smoothing reactor 4 and the smoothing capacitor 5. The smoothed power is supplied across the cathode 6 and the anode 7, thus resulted electron beam 8 irradiating the workpiece 10. The current intensity of the electron beam 8 is controlled by a biasing voltage of the controllable biasing power source 11, which is applied across the Wehnelt electrode 9 and the cathode 6. The biasing voltage is supplied from the insulating transformer 12 and the controllable biasing power source 14 and is overlapped to the beam accelerating voltage $V_A$. The controllable biasing power source 11 is controlled by, for instance, optical fibers 17. The beam accelerating voltage $V_A$ is detected by the detecting resistor 13 for the beam accelerating voltage $V_A$ to be controlled by the constant-voltage controlling circuit 14. The beam current $I_C$ (which is equivalent to the power source current $I_K$ under the condition other than generation of arcing) is detected by the detecting resistor 15 for the power source current $I_K$ to be controlled by the constant-current controlling circuit 16. Control of constant voltage and constant current is performed in such a manner that as shown in FIG. 6, difference between the feedback signal 19 and the set signal 21 is detected by the comparator 22 and a controlled signal 23 as an output of the comparator 22 is used so that the feedback signal 19 and the set signal 21 become equal by changing, for instance, a duty of an inverter when the beam accelerating voltage $V_A$ is controlled, or by changing the biasing voltage of the controllable biasing power source 11 through the optical fibers 17 when the power source current $I_K$ is controlled. In this case, when a welding operation is carried out, metallic vapor produced from a molten part of the workpiece 10 flows in a space between the anode 7 and the cathode 6 or the Wehnelt electrode 9, whereby there frequently causes arcing 18 due to a short circuit between both the electrodes. The arcing 18 in vacuum condition occurs with pulsation and is completed in about 100 μs. FIG. 7 shows voltage and current waveforms appearing specified parts in the welding machine at the time of generation of the arcing 18. The beam accelerating voltage $V_A$ once becomes zero volt when generation of the arcing 18 is finished since there is no electric charge in the smoothing capacitor 5. However, the power source output current $I_O$ of the controllable power source 1 is rapidly increased owing to the constant-voltage control and both the beam accelerating voltage $V_A$ and the power source output current $I_O$ are largely changed by a time constant (several m sec.) determined by the smoothing reactor 4 and the capacitor 5. In addition, when the arcing 18 takes place, an arcing current having a high peak value is overlapped on the power source current $I_K$ which is detected to control the beam current $I_C$. Accordingly, the constant-current controlling circuit 16 functions so as not to flow the beam current $I_C$ even though there is in fact no beam current $I_C$. Accordingly, the power source current $I_K$ and the beam current $I_C$ largely varies after generation of the arcing 18 by the influence of the change in the beam accelerating voltage $V_A$.

Thus, when the arcing 18 is once generated, the control of voltage and current becomes unstable in transition time and high voltage and current are produced. Accordingly, the second arcing 18 and the third arcing 18 are produced as shown in FIG. 8, and the output current $I_O$ of the controllable power source 1 is remarkably increased, whereby an interruption circuit for the controllable power source 1 is actuated to stop the welding operation.

FIG. 9 shows a configuration of the weld bead when the arcing 18 takes place.

When the arcing 18 is once generated, the beam accelerating voltage $V_A$ and the beam current $I_C$ are largely changed even though the power source does not stop. As a result, the width of the bead and the depth of penetration are largely varied. Particularly, when the power source is suddenly stopped due to generation of the arcing 18, molten metal is not supplied to a thin and deep hole formed by the electron beam to fill it to thereby create a deep crater. Repair of the crater is troublesome.

To improve unstableness in a control system caused by generation of the arcing, it is considered that the frequency of the low-pass filter 20 is reduced with respect to the feedback signal 19 so that response of the control system becomes sufficiently slow, whereby interruption for the power source is delayed. However, this method sacrifices controllability of the beam accelerating voltage $V_A$ and the beam current $I_C$ in normal condition.

There has been employed a method in which an irradiation path of the electron beam 8 is curved by means of a magnetic field to thereby reduce the metallic vapor entering in the space between the cathode 6 and the anode 7. However, it has been impossible to reduce the probability of generation of the arcing to zero.

SUMMARY OF THE INVENTION

It is an object of the present invention to provide a control system for a charged particle beam apparatus which does not bring about the stoppage of a power source due to increase in a beam accelerating voltage and a beam current in spite of generation of arcing, whereby defect in a workpiece can be avoided.

The present invention is to provide a control system for a charged particle beam apparatus which comprises a controllable power source for feeding a power to a beam generating part, the controllable power source being subject to feedback control in response to a beam accelerating voltage, wherein when a load-short-circuit takes place due to an electric discharge, a feedback signal in a feedback control line is fixed at a predetermined value corresponding to the feedback signal under the condition before occurrence of the load-short-circuit, and then, the fixed feedback signal is released to continue the feedback control.

Another aspect of the present invention is to provide a control system for a charged particle beam apparatus which comprises a controllable power source for feeding a power to a beam generating part, the controllable power source being subject to feedback control in response to a beam accelerating voltage, wherein when a load-short-circuit takes place due to an electric discharge, a feedback signal in a feedback control line is fixed at a predetermined value corresponding to the feedback signal under the condition before occurrence of the load-short-circuit; thereafter, the fixed feedback signal is released for the continuation of the feedback control, and application of the beam accelerating voltage is stopped at the time of load-short-circuiting, followed by reopening the application of the beam accelerating voltage before continuing the feedback control.

Another aspect of the present invention is to provide a control system for a charged particle beam apparatus which comprises a controllable power source for feeding a power to a beam generating part, the controllable power source being subject to feedback control in response to a beam accelerating voltage and a controllable biasing power source in the beam generating part, which is subject to feedback control by a power source current flowing in a power feeding circuit of the controllable power source, wherein when a load-short-circuit takes place due to an electric discharge, a feedback signal in each feedback control line for the controllable power source and the controllable biasing power source is fixed at a predetermined value corresponding to each of the feedback signals under the condition before occurrence of said load-short-circuit, and then, each of the feedback signals is released to continue the feedback control.

Still another aspect of the present invention is to provide a control system for a charged particle beam apparatus which comprises a controllable power source for feeding a power to a beam generating part, the controllable power source being subject to feedback control in response to a beam accelerating voltage and a controllable biasing power source in the beam generating part, which is subject to feedback control by a power source current flowing in a power feeding circuit of the controllable power source, wherein when a load-short-circuit takes place due to an electric discharge, a feedback signal in each feedback control line for the controllable power source and the controllable biasing power source is fixed at a predetermined value corresponding to each of the feedback signals before occurrence of the load-short-circuit; thereafter, each of the feedback signals is released to continue the feedback control, and application of the beam accelerating voltage is stopped at the time of the load-short-circuiting, followed by reopening the application of the beam accelerating voltage before continuing the feedback control.

DETAILED DESCRIPTION OF PREFERRED EMBODIMENTS

An embodiment of the present invention will be described with reference to drawing.

Figure 1:
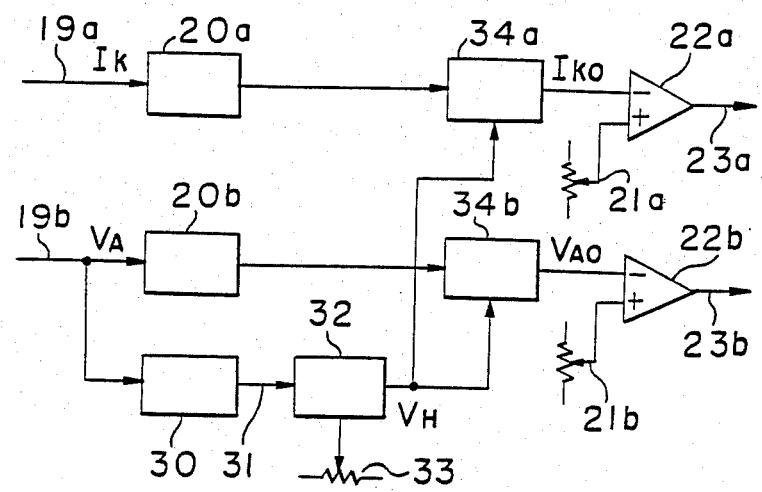
FIG. 1 is a diagram of an embodiment of a control circuit for a beam accelerating voltage and a power source current of the present invention.
Figure 4:
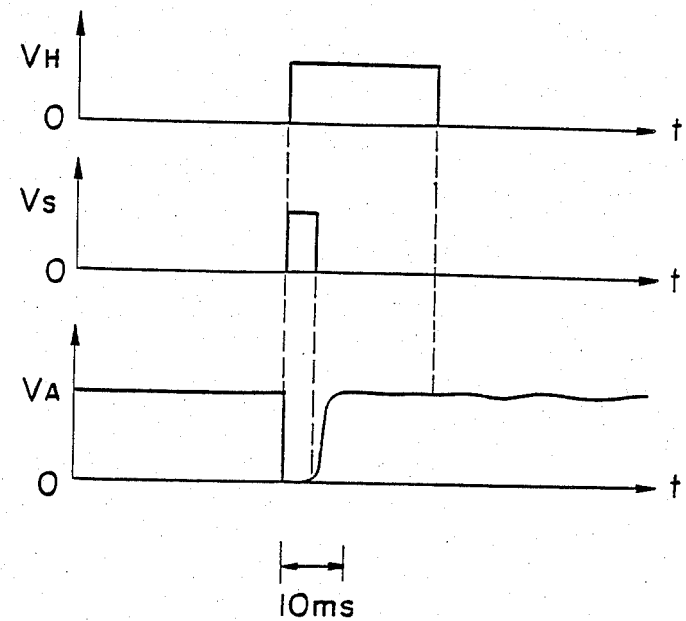
FIG. 4 shows waveforms of voltage and current appearing at specified parts in FIG. 3 when a load-short-circuit occurs.

FIG. 1 is a diagram of the constant-voltage and constant-current control circuit of an embodiment according to the present invention.

FIG. 1 is a diagram showing the construction of a constant-voltage and constant-current control circuit. A reference numeral 19a designates a feedback signal from a power source current $I_K$, a numeral 19b designates a feedback signal from a beam accelerating voltage $V_A$, a numeral 20a designates a low-pass filter for the feedback signal 19a of the power source current, a numeral 20b designates a low-pass filter for the feedback signal 19b of the beam accelerating voltage $V_A$, a numeral 30 designates a detecting circuit for detecting generation of arcing 18 according to the feedback signal 19b of the beam accelerating voltage $V_A$, a numeral 31 designates a trigger pulse output from the detecting circuit 30 as soon as the arcing 18 takes place, a numeral 32 designates a monostable multivibrator actuated by the trigger pulse 31, a numeral 33 designates a pulse-width determining device for the monostable multivibrator 32, a numeral 34a designates a sampling-hold circuit for the feedback signal 19a of the power source current $I_K$, a numeral 34b designates a sampling-hold circuit for the feedback signal 19b of the beam accelerating voltage $V_A$, and a symbol $V_H$ indicates a holding signal which is output from the monostable multivibrator 32 to keep the sampling-hold circuits 34a, 34b inactive. A symbol $V_{AO}$ indicates an output signal of the sampling-hold circuit 34b, a symbol $I_{KO}$ indicates an output signal of the sampling-hold circuit 34a, numerals 21a and 21b indicate set signals, a numeral 22a designates a comparator for comparing the output signal of the sampling-hold circuit 34a with the setting signal 21a, a numeral 22b designates a comparator for comparing the output signal of the sampling-hold circuit 34b with the setting signal 21b, a numeral 23a designates a controlled signal of the power source current $I_K$ and a numeral 23b is a controlled signal of the beam accelerating voltage $V_A$.

Figure 2:
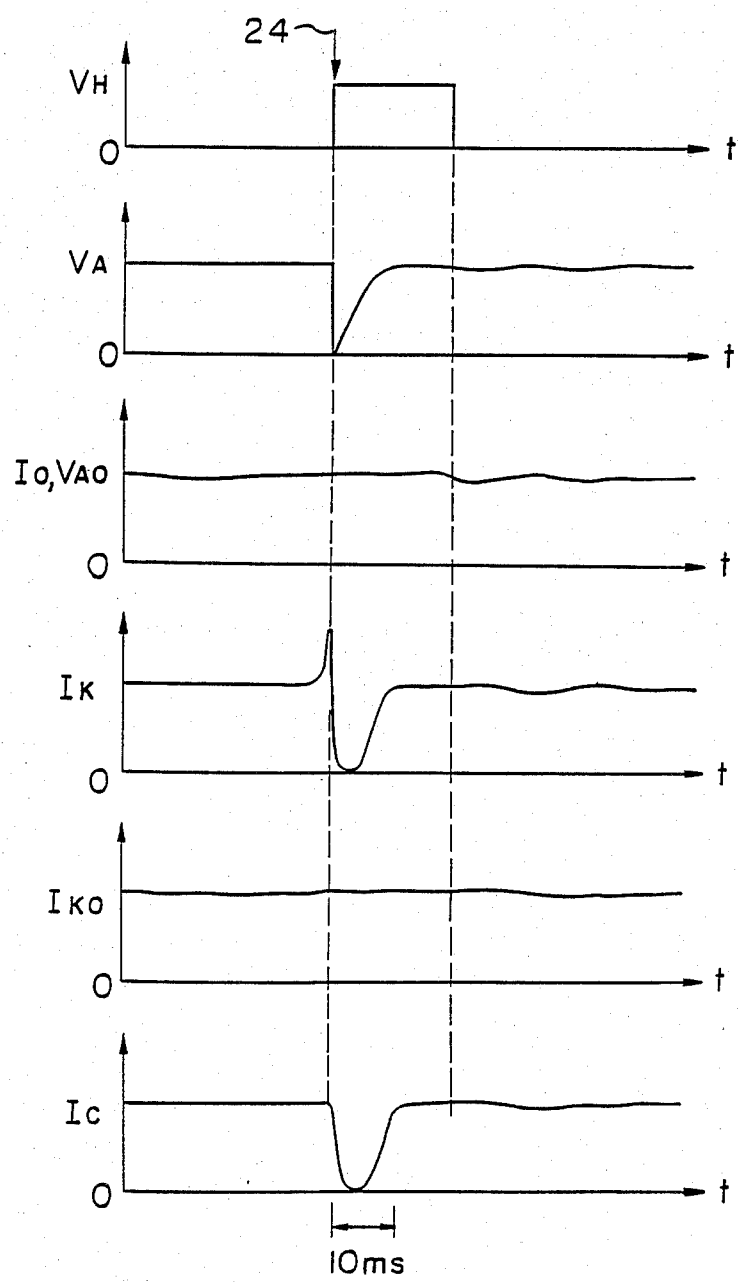
FIG. 2 is waveforms of the voltage and current appearing at specified parts in FIG. 1 when a load-short-circuit occurs.

FIG. 2 shows voltage and current waveforms appearing at specified parts of the welding machine according to the present invention when the arcing 18 takes place.

Figure 5:
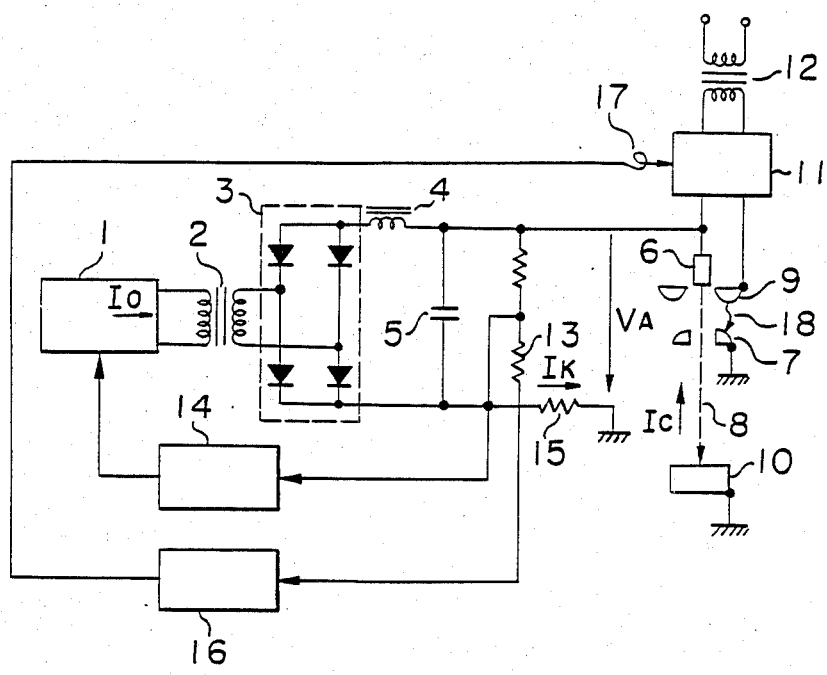
FIG. 5 is a diagram showing a construction of a conventional electron beam welding machine.
Figure 6:
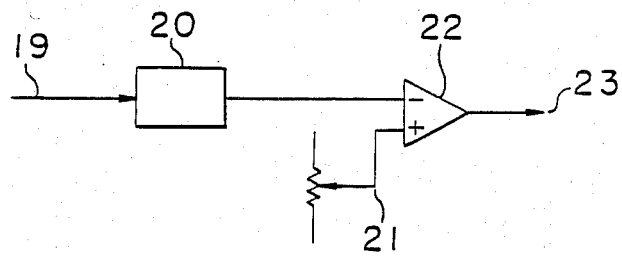
FIG. 6 is a diagram of a conventional control circuit for a beam accelerating voltage and a power source current.
Figure 7:
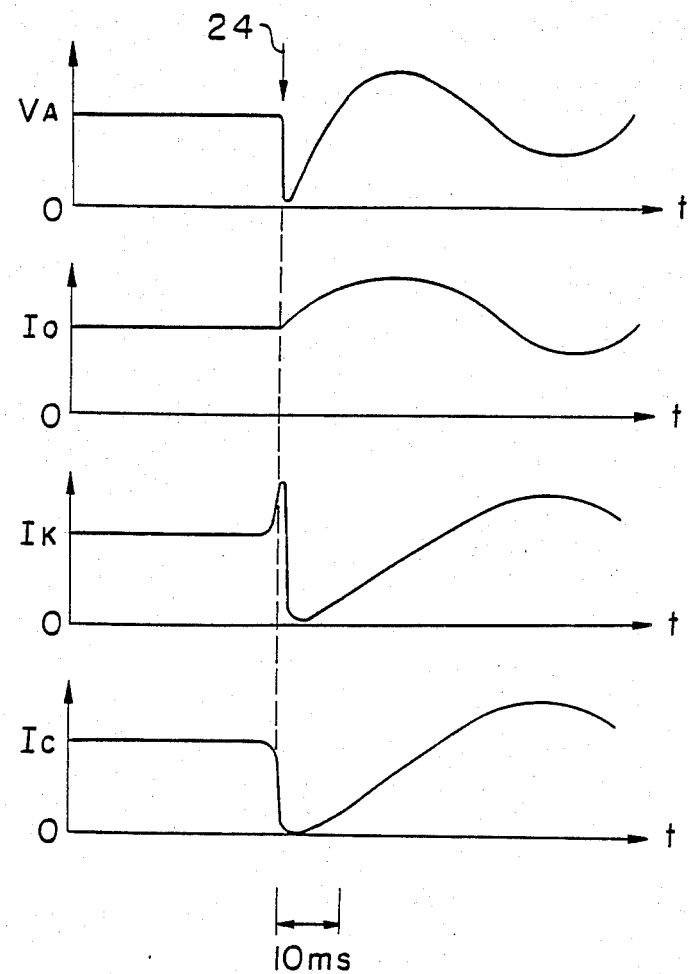
FIGS. 7 and 8 respectively waveforms of voltage and current appearing at specified parts of the conventional apparatus when a load-short-circuit occurs.
Figure 8:
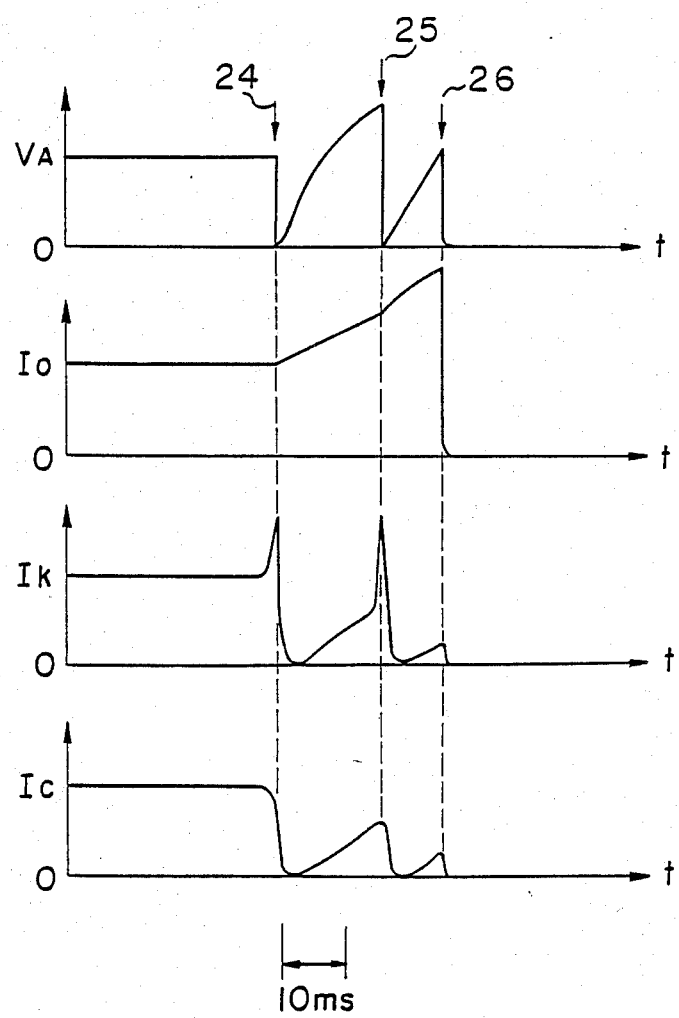
Figure 9:
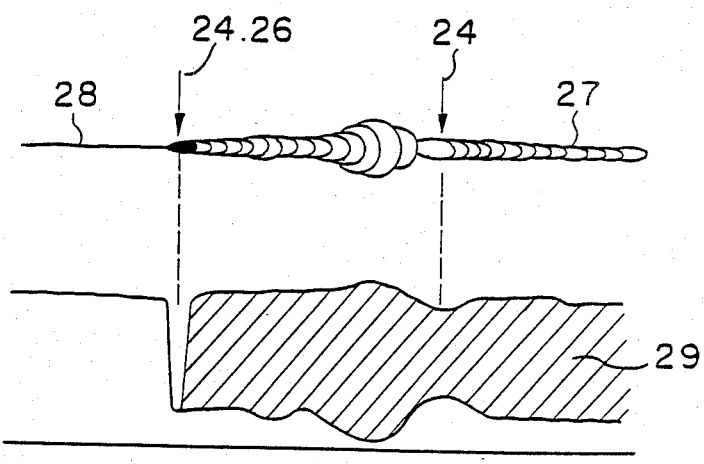
FIG. 9 is a schematic view showing defect of weld bead caused by generation of load-short-circuit in the conventional apparatus.

FIG. 1 is a circuit diagram of an embodiment of the present invention, which corresponds to the constant-voltage control circuit 14 and the constant-current control circuit 16 as shown in FIG. 5. The construction other than the control circuits 14, 16 can be employed for the embodiment of the present invention.

The operation of the embodiment of the present invention will be described with reference to FIGS. 1 to 4.

On generation of the arcing 18, the beam accelerating voltage $V_A$ and the power source current $I_K$ suddenly vary.

Accordingly, when the feedback signal 19b of the beam accelerating voltage $V_A$ is input to the detecting circuit 30 composed of a comparator or a differential circuit to detect generation of the arcing, the trigger pulse 31 indicative of the generation of the arcing 18 is produced. When the monostable multivibrator 32 receives the trigger pulse 31, it generates the holding signal $V_H$ for the sampling-hold circuits 34a and 34b whereby the feedback signal 19a of the power source current $I_K$ and the feedback signal 19b of the beam accelerating voltage $V_A$ are held. In this case, it is unnecessary for the feedback signal 19b to be passed through the low-pass filter 20b because the detecting circuit 30 deals the feedback signal 19b having a large variation quantity of the generation of arcing 18 and therefore, the function of the detecting circuit 30 is not influenced even though there is some quantity of noise. Accordingly, the holding signal $V_H$ is quickly input in the sampling-hold circuits 34a, 34b whereby the feedback signal 19a of the power source current $I_K$ and the feedback signal 19b of the beam accelerating voltage $V_A$ having respective values at the time of generation of the arcing 18 can be held (the level of signals is substantially at the value just before generation of the arcing 18 because the low-pass filters 20a, 20b are provided). In other words, when the arcing 18 is generated, control is carried out by the feedback signals 19a, 19b having normal values just before generation of the arcing 18, and the quantity of sudden change in the beam accelerating voltage $V_A$ and the power source current $I_K$ after generation of the arcing 18 is neglected. Accordingly, a control system of this embodiment can be operated in a stable manner. The beam accelerating voltage $V_H$ is returned to the normal condition within several ms although time of return is determined by a time constant given by the smoothing reactor 4 and the smoothing capacitor 5. Accordingly, holding time can be determined to be 20 ms by adjusting the pulse-width determining device 33. Namely, the control circuit of the present invention is operated in such a manner that when arcing 18 takes place, change in control is made from an ordinary feedback control to an open control in which data just before generation of the arcing 18 is used, and the feedback control is again initiated after the beam accelerating voltage $V_A$ and the power source current $I_K$ are returned to substantially normal values. Even though there is generally large variation in the open control, the open control according to this embodiment is based on data of feedback control just before generation of the arcing 18, and further, the period of the open control is short as much as several tens ms or less. Accordingly, the open control of this embodiment is highly accurate as the feedback control.

FIG. 2 shows voltage and current waveforms. When the arcing 18 takes places, the sampling-hold circuits 34a and 34b are actuated. A beam accelerating voltage signal $V_{AO}$ and a power source current signal $I_{KO}$ input in a control circuit do not show substantial change and the beam accelerating voltage $V_A$ and the power source current $I_K$ are smoothly returned to normal condition. A slight change occurs when the feedback control is started again in order to correct errors resulted in the open control. Accordingly, the output current $I_O$ of the controllable power source 1 does not substantially change and there causes no interruption of the controllable power source 1.

In this embodiment, the beam accelerating voltage $V_A$ and the beam current $I_C$ are interrupted for about 10 ms. However, when the speed of welding in typical 6 kW and 100 kW welding machines are respectively determined to be 1 m/min and 0.3 m/min, the distance of movement of electrode in the interruption time of the beam accelerating voltage $V_A$ and the beam current $I_C$ are respectively 170 μm and 50 μm. Accordingly, no defect is found in welded portion even though there is a trace on the surface of a weld bead.

In the above-mentioned embodiment, a control system is constituted by the sampling-hold circuit 34b for the feedback signal 19b of the beam accelerating voltage $V_A$ and the sampling-hold circuit 34a for the feedback signal 19a of the power source current $I_K$. However, the object of the present invention can be attained by constructing the control system by only the sampling-hold circuit 34b for the feedback signal 19b of the beam accelerating voltage $V_A$.

The values of the feedback signals 19a and 19b are not always the same as values just before generation of the arcing 18. The same effect can be obtained by a value lower than a value just before generation of the arcing 18 due to the delay of the holding signal $V_H$.

Figure 3:
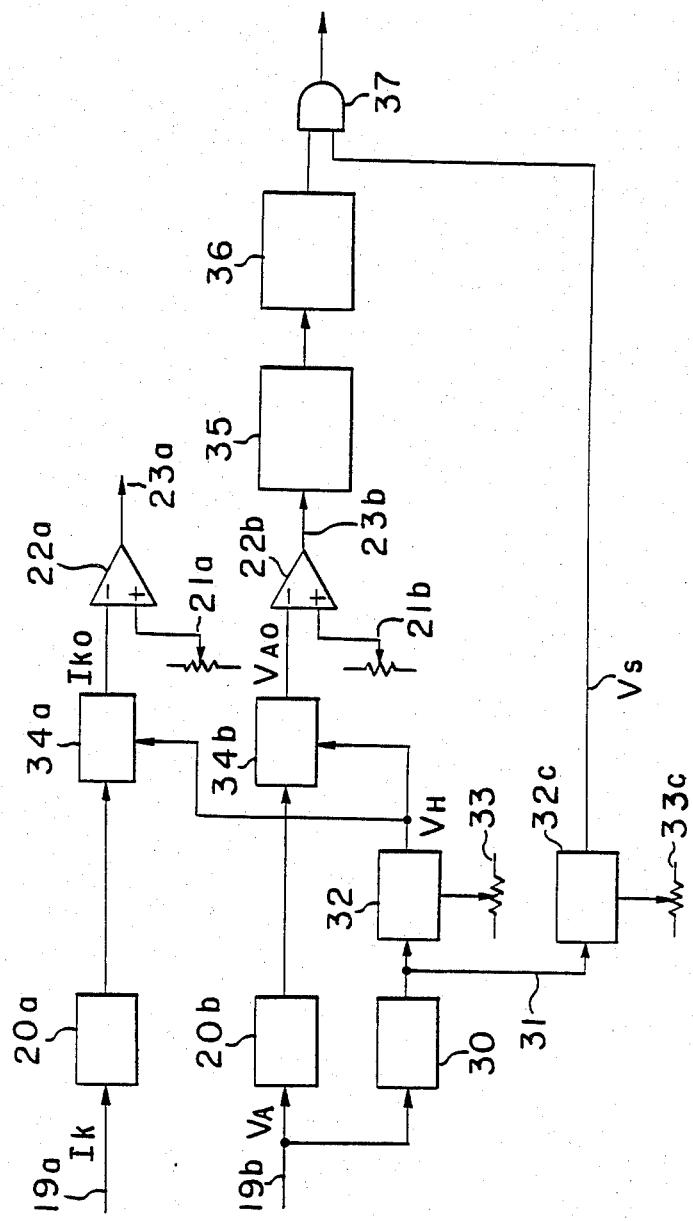
FIG. 3 is a diagram of another embodiment of the control circuit for a beam accelerating voltage and a power source current according to the present invention.

In the above-mentioned embodiment, the controllable power source 1 which may be a power source for an inverter is actuated even if the arcing 18 takes place. However, it may be such construction as shown in FIG. 3 that the power source is instantaneously stopped. This construction is effective in the case that the operational frequency of the inverter is so high that the arcing 18 of, for instance, about 100 μs to about 1 ms may occurs again when the beam accelerating voltage $V_A$ is immediately returned to normal condition.

In FIG. 3, when the trigger pulse 31 indicative of generation of the arcing 18 is input another monostable multivibrator 32c, a pulse $V_S$ is produced to instantaneously stop the inverter. Preferably, the time for stopping the inverter is determined by adjusting the pulse-width determining device 33c so as to be several ms. The outputs of a PID (proportion-integration-differential) circuit 35 for giving constant-voltage control to the beam accelerating voltage $V_A$ and a PWM (pulse-width-modulation) circuit 36 is instantaneously interrupted by a pulse $V_S$ for instantaneously stopping an inverter. Accordingly, it is possible to stop supply of the beam accelerating voltage $V_A$ for a suitable time as shown in a waveform in FIG. 4.

In the above-mentioned embodiment, data of the feedback signal 19 in the condition just before generation of the arcing 18 is held by utilizing time delay of the feedback signal 19 by means of the low-pass filter 20. However, it is possible to use the pre-trigger function of a digital type waveform memory device in which the feedback signal 19 is successively written in a RAM, and data in the condition just before generation of the arcing 18 can be read out when the trigger pulse 31 is input.

Description has been made as to a control system for an electron beam welding machine as an example of the present invention. However, the same effect can be obtained in a charged particle beam apparatus of a high voltage, e.g. an ion implantation device. In this case, it is possible to minimize adverse affect against a workpiece during arcing.

As stated above, the control system for a charged particle beam apparatus of the present invention is so constructed that when generation of arcing is detected, feedback signals of the beam accelerating voltage and the power source current are held at predetermined values corresponding to the feedback signals in the condition just before generation of the arcing and open control is carried out for several tens ms until the beam accelerating voltage and the power source current are returned to normal condition, and thereafter, feedback control of a high speed is restarted. Accordingly, the control system is operated in a stable manner even in the arcing and the controllable power source can be automatically returned within a short time whereby any defect takes place in the workpiece which is subject to irradiation of the electron beam.

What is claimed is:

1. A control system for a charged particle beam apparatus which comprises a controllable power source for feeding a power to a beam generating part, said controllable power source being subject to feedback control in response to a beam accelerating voltage, wherein when a load-short-circuit takes place due to an electric discharge, a feedback signal in a feedback control line is fixed at a predetermined value corresponding to said feedback signal under the condition before occurrence of the load-short-circuit, and then, said fixed feedback signal is released for the continuation of the feedback control.

2. A control system for a charged particle beam apparatus according to claim 1, which comprises a detecting means for detecting the generation of arcing from a feedback signal in said beam accelerating voltage and a sampling-hold circuit for holding said feedback signal in response to an output from said detecting means.

3. A control system for a charged particle beam apparatus according to claim 2, wherein said sampling-hold circuit is connected between a low-pass filter and a comparator and said detecting circuit is connected in parallel to said low-pass filter to detect variation in said feedback signal and to actuate said sampling-hold circuit through a monostable multivibrator.

4. A control system for a charged particle beam apparatus which comprises a controllable power source for feeding a power to a beam generating part, said controllable power source being subject to feedback control in response to a beam accelerating voltage, wherein when a load-short-circuit takes place due to an electric discharge, a feedback signal in a feedback control line is fixed at a predetermined value corresponding to said feedback signal under the condition before occurrence of the load-short-circuit; thereafter, said fixed feedback signal is released to continue the feedback control, and application of said beam accelerating voltage is stopped at the time of the load-short-circuting, followed by reopening the application of said beam accelerating voltage before continuing said feedback control.

5. A control system for a charged particle beam apparatus according to claim 4, which comprises a detecting means for detecting the generation of arcing from a feedback signal in said beam accelerating voltage; a sampling-hold circuit for holding said feedback signal in response to an output from said detecting means and a pulse generator for stopping an inverter for a short time.

6. A control system for a charged particle beam apparatus according to claim 5, wherein said sampling-hold circuit is connected between a low-pass filter and a comparator in a serial connection of said low-pass filter, said comparator, a PID circuit, a PWM circuit and a gate circuit; said detecting circuit is connected in parallel to said low-pass filter to detect variation in said feedback signal and actuate said sampling-hold circuit through a monostable multivibrator, and an additional monostable multivibrator is connected between the output side of said detecting means and said gate circuit.

7. A control system for a charged particle beam apparatus which comprises a controllable power source for feeding a power to a beam generating part, said controllable power source being subject to feedback control in response to a beam accelerating voltage and a controllable biasing power source in said beam generating part, which is subject to feedback control by a power source current flowing in a power feeding circuit of said controllable power source, wherein when a load-short-circuit takes place due to an electric discharge, a feedback signal in each feedback control line for said controllable power source and said controllable biasing power source is fixed at a predetermined value corresponding to each of said feedback signals under the condition before said load-short-circuit occurs, and then, each of said feedback signals is released to continue the feedback control.

8. A control system for a charged particle beam apparatus according to claim 7, which comprises a detecting means for detecting the generation of arcing from a feedback signal in said beam accelerating voltage and a sampling-hold circuit provided in each of said feedback lines for the controllable power source and the controllable biasing power source to hold each of said feedback signals in response to an output from said detecting means.

9. A control system for a charged particle beam apparatus according to claim 8, wherein said sampling-hold circuit is connected between a low-pass filter and a comparator in a serial connection of said low-pass filter, said comparator, a PID circuit, a PWM circuit and a gate circuit; said detecting circuit is connected in parallel to said low-pass filter to detect variation in said feedback signal in said beam accelerating voltage and actuates said sampling-hold circuits through a monostable multivibrtor, and an additional monostable multivibrator is connected between the output side of said detecting means and said gate circuit.

10. A control system for a charged particle beam apparatus which comprises a controllable power source for feeding a power to a beam generating part, said controllable power source being subject to feedback control in response to a beam accelerating voltage and a controllable biasing power source in said beam generating part, which is subject to feedback control-by a power source current flowing in a power feeding circuit of said controllable power source, wherein when a load-short-circuit circuit takes place due to an electric discharge, a feedback signal in each feedback control line for said controllable power source and said controllable biasing power source is fixed at a predetermined value corresponding to each of said feedback signals under the condition before said load-short-circuit occurs; thereafter, each of said feedback signals is released to continue the feedback control, and application of said beam accelerating voltage is stopped at the time of the load-short-circuit, followed by reopening the application of said beam accelerating voltage before continuing said feedback control.

11. A control system for a charged particle beam apparatus according to claim 10, which comprises a detecting means for detecting the generation of arcing from a feedback signal in said beam accelerating voltage and a sampling-hold circuit provided in each of said feedback lines for the controllable power source and the controllable biasing power source to hold each of said feedback signals in response to an output from said detecting means.

12. A control system for a charged particle beam apparatus according to claim 11, wherein said sampling-hold circuit for the feedback signal of said beam accelerating voltage is connected between a low-pass filter and a comparator in a serial connection of said low-pass filter, said comparator, a PID circuit, a PWM circuit and a gate circuit; said detecting circuit is connected in parallel to said low-pass filter to detect variation in said feedback signal of said beam accelerating voltage and actuates said sampling-hold circuits through a monostable multivibrator, and an additional monostable multivibrator is connected between the output side of said detecting means and said gate circuit.

* * * * *